United States Patent
Yoshida et al.

(10) Patent No.: US 9,594,215 B2
(45) Date of Patent: Mar. 14, 2017

(54) SEMICONDUCTOR LIGHT-RECEIVING ELEMENT

(71) Applicants: KABUSHIKI KAISHA TOSHIBA, Minato-ku (JP); Photonics Electronics Technology Research Association, Bunkyo-ku (JP)

(72) Inventors: Haruhiko Yoshida, Funabashi (JP); Kazuya Ohira, Tokyo (JP); Mizunori Ezaki, Yokohama (JP)

(73) Assignees: KABUSHIKI KAISHA TOSHIBA, Minato-ku (JP); Photonics Electronics Technology Research Association, Bunkyo-ku (JP)

( * ) Notice: Subject to any disclaimer, the term of this patent is extended or adjusted under 35 U.S.C. 154(b) by 0 days.

(21) Appl. No.: 14/850,285

(22) Filed: Sep. 10, 2015

(65) Prior Publication Data
US 2016/0087398 A1    Mar. 24, 2016

(30) Foreign Application Priority Data
Sep. 19, 2014    (JP) ................................. 2014-190679

(51) Int. Cl.
*G02B 6/26*    (2006.01)
*G02B 6/42*    (2006.01)
(Continued)

(52) U.S. Cl.
CPC ....... *G02B 6/29338* (2013.01); *G02B 6/1228* (2013.01); *G02B 6/29341* (2013.01);
(Continued)

(58) Field of Classification Search
CPC .............. G02B 6/29338; G02B 6/1228; G02B 6/29341; H01S 5/1075
(Continued)

(56) References Cited

U.S. PATENT DOCUMENTS 6,978,067 B2    12/2005  Herbert et al.
6,987,913 B2 *   1/2006  Blauvelt ............ G02B 6/12002
                                                385/28
(Continued)

FOREIGN PATENT DOCUMENTS

JP    2003-534650         11/2003
JP    2012-204706    * 10/2012 ............. H01L 31/10
(Continued)

OTHER PUBLICATIONS

Official Action issued in JP 2014-190679 on Aug. 3, 2015, with English-language translation (4 pp.)

*Primary Examiner* — Robert Tavlykaev
(74) *Attorney, Agent, or Firm* — Oblon, McClelland, Maier & Neustadt, L.L.P.

(57) ABSTRACT

According to one embodiment, a semiconductor light-receiving element, includes a light-receiving part provided on a substrate and having a semiconductor multilayer structure of a circular outer shape, a optical input part formed of a peripheral portion of the semiconductor multilayer structure, and having a tapered front end, and a silicon-thin-line waveguide configured to couple light with the optical input part. The waveguide includes a linear part extending through the optical input part to an at least one area of an upper-side area and a lower-side area of the light-receiving part, and a spiral part connected to the linear part and formed in the at least one area.

20 Claims, 8 Drawing Sheets

(51) Int. Cl.
   *G02B 6/12*     (2006.01)
   *G02B 6/293*    (2006.01)
   *G02B 6/122*    (2006.01)
   *H01S 5/026*    (2006.01)
   *H01S 5/10*     (2006.01)

(52) U.S. Cl.
   CPC .. *H01S 5/0264* (2013.01); *G02B 2006/12061* (2013.01); *G02B 2006/12078* (2013.01); *H01S 5/1075* (2013.01)

(58) Field of Classification Search
   USPC .................................. 385/14, 31, 32, 38, 50
   See application file for complete search history.

(56) References Cited

U.S. PATENT DOCUMENTS

| | | | |
|---|---|---|---|
| 7,515,793 B2* | 4/2009 | Dehlinger | G02B 6/12004 385/129 |
| 8,958,665 B2* | 2/2015 | Evans | G02B 6/12016 385/11 |
| 9,231,131 B2* | 1/2016 | Assefa | H01L 31/02327 |
| 2004/0013367 A1 | 1/2004 | Herbert et al. | |
| 2009/0324163 A1* | 12/2009 | Dougherty | B82Y 20/00 385/14 |
| 2014/0044391 A1 | 2/2014 | Iizuka et al. | |
| 2015/0214425 A1* | 7/2015 | Taylor | H01S 5/0421 385/14 |

FOREIGN PATENT DOCUMENTS

| | | |
|---|---|---|
| JP | 2012-204706 A | 10/2012 |
| JP | 2013-191704 A | 9/2013 |
| JP | 2014-35498 A | 2/2014 |

* cited by examiner

Total reflection is reduced by 1/10

SEMICONDUCTOR LIGHT-RECEIVING ELEMENT

CROSS-REFERENCE TO RELATED APPLICATIONS

This application is based upon and claims the benefit of priority from Japanese Patent Application No. 2014-190679, filed Sep. 19, 2014, the entire contents of which are incorporated herein by reference.

FIELD

Embodiments described herein relate generally to a semiconductor light-receiving element suitable for, for example, optical interconnection.

BACKGROUND

In recent years, various types of on-chip optical interconnection for performing data input/output at high speed and low power have been proposed for achieving low-loss, high-density optical transmission. In order to realize such optical interconnection, a micro-ring LD using a micro-ring resonator is attracting attention as a small light source. Since, however, the output of this type micro-ring LD is unstable because of return light reflected from a waveguide for optical output, it is necessary to suppress the ratio of the return light to 0.01% or less.

In a light-receiving element for receiving light from the micro-ring LD, it is desired to enable the light-receiving element and the micro-ring LD to be mounted on one chip (wafer). However, it is difficult to realize a semiconductor light-receiving element that can be mounted on a single chip along with the micro-ring LD and can exhibit high efficiency and sufficiently reduced reflection.

DETAILED DESCRIPTION

In general, according to one embodiment, there is provided a semiconductor light-receiving element, comprising: a light-receiving part provided on a substrate and having a semiconductor multilayer structure of a circular outer shape; a optical input part formed of a circumferential extension of a peripheral portion of the semiconductor multilayer structure, and having a tapered front end; and a silicon-thin-line waveguide configured to couple light with the optical input part, the silicon-thin-line waveguide including a linear part extending through the optical input part to an at least one area of an upper-side area and a lower-side area of the light-receiving part, and a spiral part connected to the linear part and formed spirally in the at least one area.

Semiconductor light-receiving elements according to embodiments will be described with reference to the accompanying drawings.

First Embodiment

Figure 1:
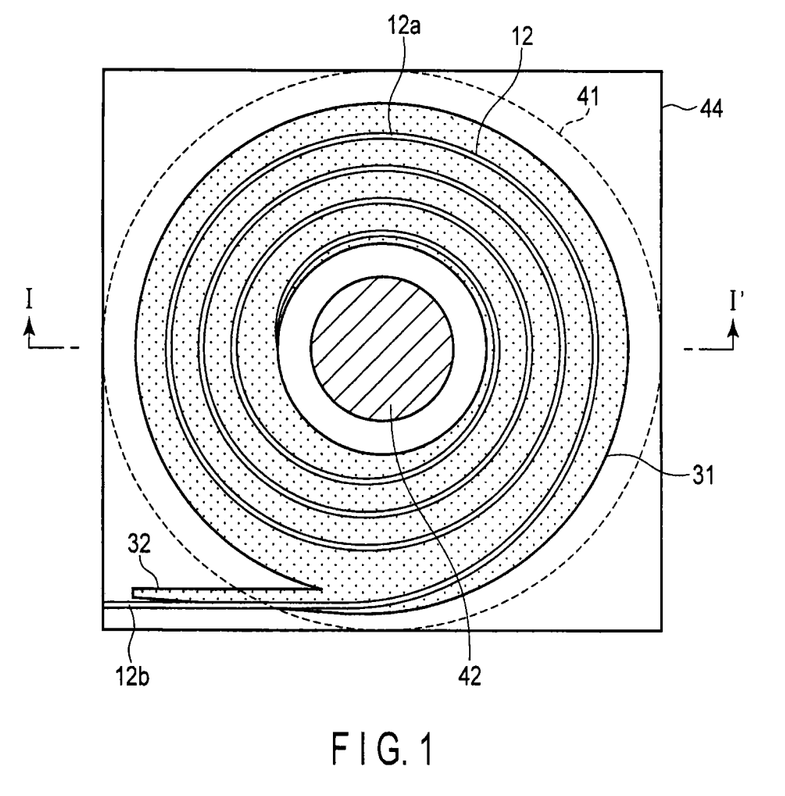
FIG. 1 is a plan view showing a schematic structure of a semiconductor light-receiving element according to a first embodiment.
Figure 2:
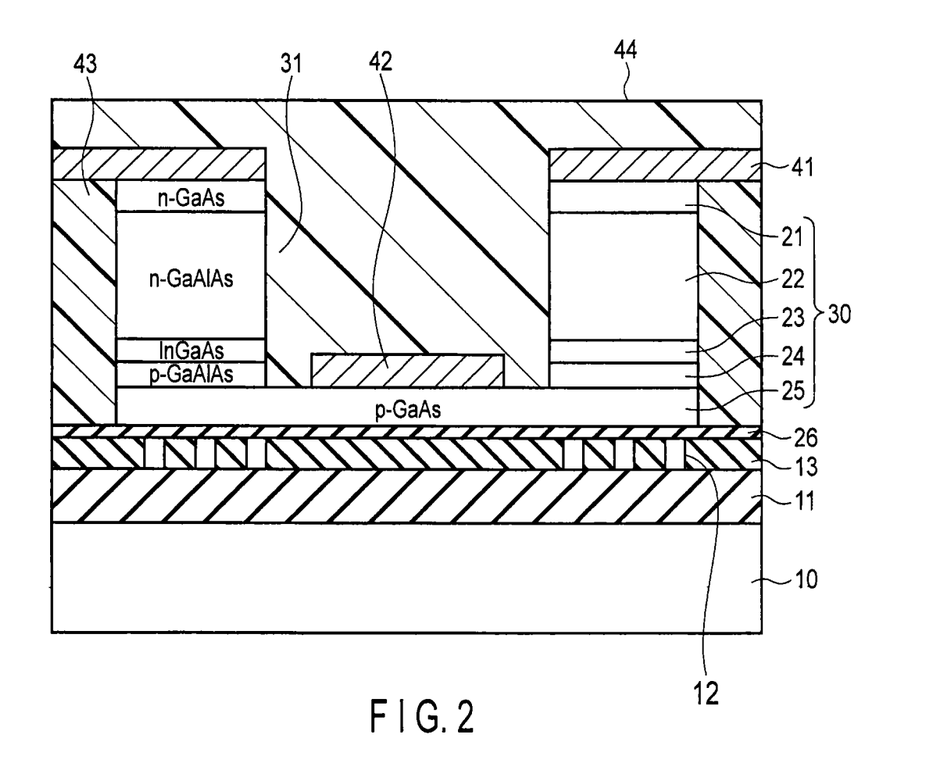
FIG. 2 is a cross-sectional view showing a schematic structure of the semiconductor light-receiving element according to the first embodiment.

FIGS. 1 and 2 are views for explaining a schematic structure of a semiconductor light-receiving element according to a first embodiment. FIG. 1 is a plan view showing the positional relationship between a light-receiving part, an optical input part and a waveguide. FIG. 2 is a cross-sectional view taken along line I-I' of FIG. 1. FIG. 1 only shows necessary structural constituents for enabling the feature of the first embodiment to be easily understood.

By a semiconductor process, an Si-thin-line waveguide 12 covered with a material of low refractive index is formed on an Si substrate 10, and a light-receiving part 31 formed of a semiconductor multilayer structure 30 to detect light is joined on it.

More specifically, an Si or a-Si layer provided on the Si substrate 10 via an embedded insulating layer 11 is formed into a spiral Si-thin-line waveguide 12. The Si-thin-line waveguide 12 has spiral part 12a formed spirally and linear part 12b formed straight and connected to the outermost end of spiral part 12a. On the Si-thin-line waveguide 12, the light-receiving part 31 shaped like a ring formed of the semiconductor multilayer structure 30 that includes a photoactive layer is joined on the Si-thin-line waveguide 12. In order to reduce return light at a terminal, the width of the waveguide is further reduced in a position closer to the terminal. Namely, the light-receiving-part side of the Si-thin-line waveguide 12 is tapered.

The light-receiving part 31 is obtained by forming a p-type GaAs contact layer 25 on one side of a double-hetero structure in which an InGaAs active layer 23 is held between GaAlAs clad layers 22 and 24, and forming an n-type GaAs contact layer 21 on the other side. The p-type GaAs contact layer 25 is joined on the waveguide 12, with an oxide film 26 formed of, for example, $SiO_2$ interposed therebetween. The active layer 23 may have a structure in which an InGaAs/GaAs multiplex quantum well layer comprising alternately stacked well layers and blocking layers is held between GaAs light blocking layers.

The semiconductor multilayer structure 30 comprising the semiconductor layers 21 to 25 is processed into a circular shape to thereby form the light-receiving part 31, and an optical input part 32 for introducing light to part of the periphery of the structure. The optical input part 32 is provided along linear part 12b of the Si-thin-line waveguide 12, and has its front end tapered. Moreover, the semiconductor multilayer structure 30 is etched from the n-type GaAs contact layer 21 to the p-type GaAlAs clad layer 24, thereby forming a circular opening. As a result, the light-receiving part 31 is substantially ring-shaped.

An n-side electrode 41 is formed on the upper surface of the n-type GaAs contact layer 21, and a p-side electrode 42 is formed on the p-type GaAs contact layer 25. In FIG. 2, reference numbers 43 and 44 indicate protective insulation films formed of, for example, polyimide.

Further, although not shown in the figure, the light-receiving part 31 and the optical input part 32 are formed on parts of the Si substrate 10, and a micro-ring LD, for example, which are optically connected to the Si-thin-line waveguide 12, are formed on other areas of the Si substrate 10.

Figure 3A:
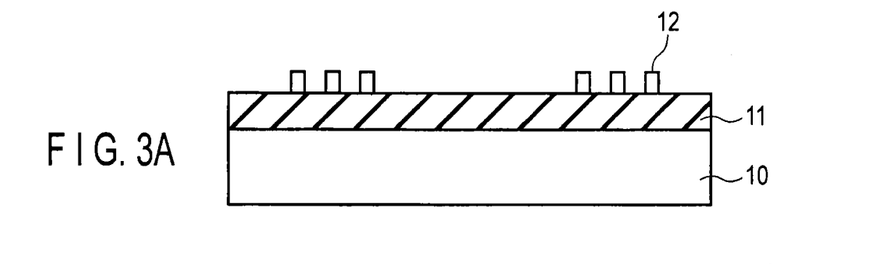
FIGS. 3A to 3D are cross-sectional views showing a manufacturing process of the semiconductor light-receiving element according to the first embodiment.

To manufacture the above element, firstly, a thin Si or amorphous Si layer on an SOI substrate is processed as shown in FIG. 3A, thereby preparing a wafer with the above-mentioned spiral Si-thin-line waveguide 12 shown in FIG. 1.

Figure 3B:
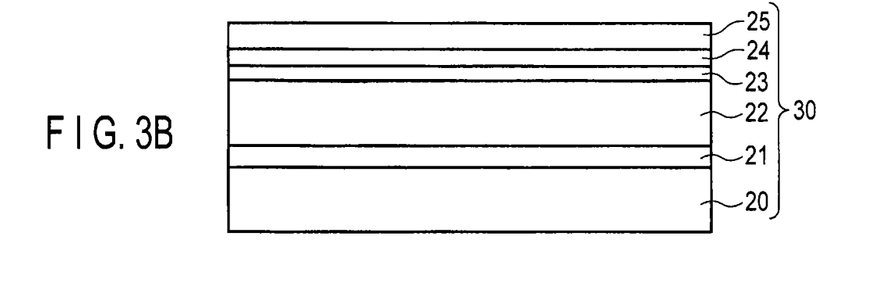

On the other hand, as shown in FIG. 3B, a semiconductor multilayer structure 30, which comprises an n-type GaAs slab layer (also serving as a contact layer) with a thickness of 200 nm, an n-type GaAlAs clad layer 22 with a thickness of 1.6 µm, an InGaAs active layer 23 with a thickness of 5 nm, a p-type GaAlAs clad layer 24 with a thickness of 250 nm and a p-type GaAs contact layer 25 with a thickness of 200 nm, is formed on a GaAs substrate 20 by epitaxial growth (MOCVD).

Figure 3C:
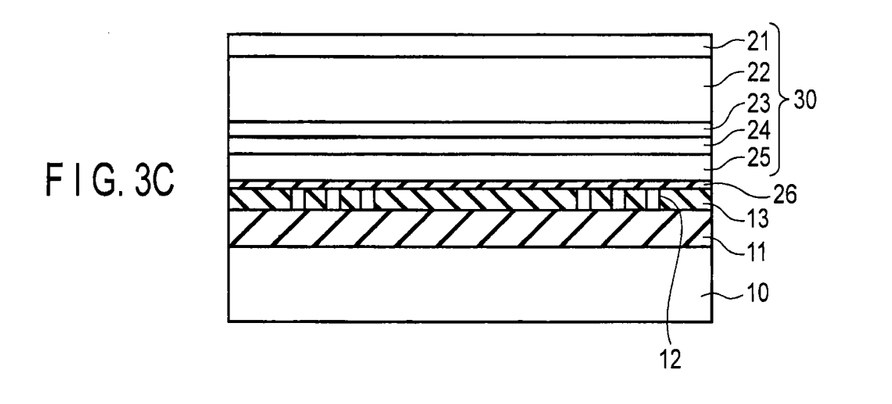

Subsequently, as shown in FIG. 3C, the semiconductor multilayer structure 30 shown in FIG. 3B is joined on the wafer shown in FIG. 3A, with the p-type GaAs contact layer 25 positioned lowest. At this time, an oxide film 13 of, for example, $SiO_2$ is embedded to cover the side parts of Si-thin-line waveguide 12, thereby flattening the surface of the resultant structure. Furthermore, a thin oxide film 26 is formed on the p-type GaAs contact layer 25, and is joined on the wafer. After that, the GaAs substrate 20 is removed.

Figure 3D:
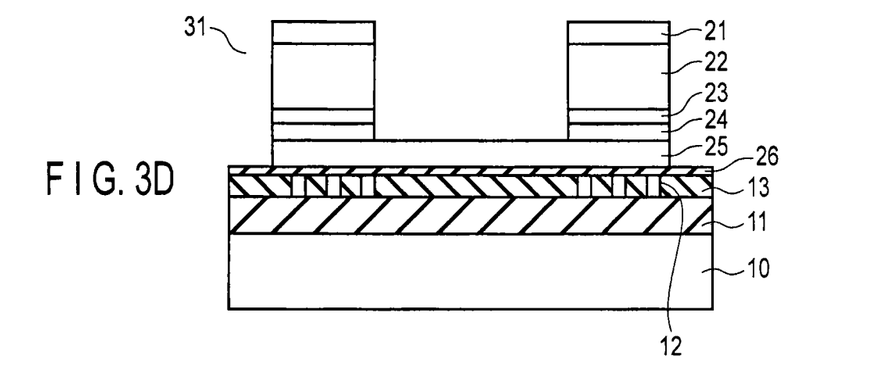

Subsequently, as shown in FIG. 3D, the semiconductor multilayer structure 30 is patterned to form a ring-shaped light-receiving part 31 and a front-tapered optical input part 32. More specifically, the layers 21 to 25 of the multilayer structure are selectively etched by, for example, RIE to reach the oxide film 26 and to leave a circular portion that will serve as the light-receiving part 31, and a leading portion that will serve as the optical input part 32. Further, a circular opening is formed by etching the center portion of the circular portion to reach the contact layer 25. As a result, the ring-shaped light-receiving part 31 is formed.

After that, an n-side electrode 41 is formed on the upper surface of the ring-shaped light-receiving part 31, and a p-side electrode 42 is formed on the p-type GaAs contact layer 25 exposed through the opening. Further, protective insulating films 43 and 44 of, for example, polyimide, etc., are formed to thereby complete the semiconductor light-receiving element of the first embodiment.

Figure 4:
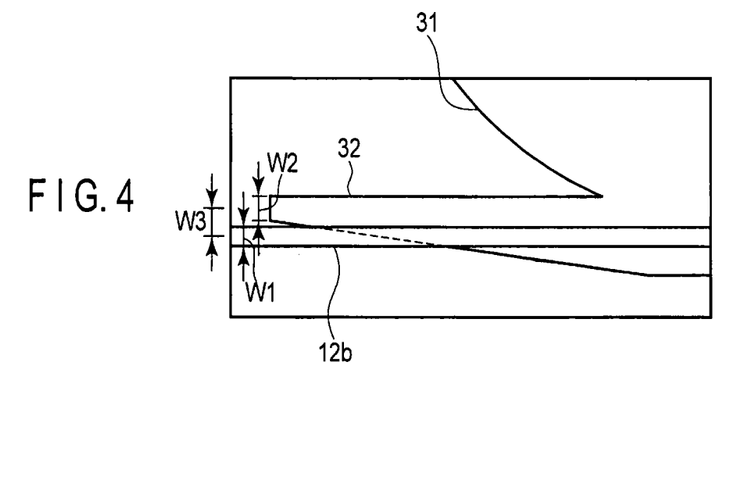
FIG. 4 is an enlarged plan view showing a part of the first embodiment.

FIG. 4 is an enlarged plan view showing the optical input part 32 and its vicinity. The optical input part 32 circumferentially extends like a line from an outermost peripheral portion of the ring-shaped light-receiving part 31, and has its front end tapered. The optical input part 32 and the Si-thin-line waveguide 12 are deviated from each other in lateral center. Namely, the optical input part 32 obliquely intersects the linear part 12b of the Si-thin-line waveguide 12. Thus, in the first embodiment, the front end of the optical input part 32 is tapered, and the optical input part 32 obliquely intersects the linear part 12b of the Si-thin-line waveguide 12.

In FIG. 4, W1 indicates the width of the Si-thin-line waveguide 12 at the optical input part 32, W2 indicates the width of the front end of the optical input part 32, and W3 indicates the distance (lateral shift amount) between the lateral center of the Si-thin-line waveguide 12 at the optical input part 32, and that of the front end of the optical input part 32.

Figure 5A:
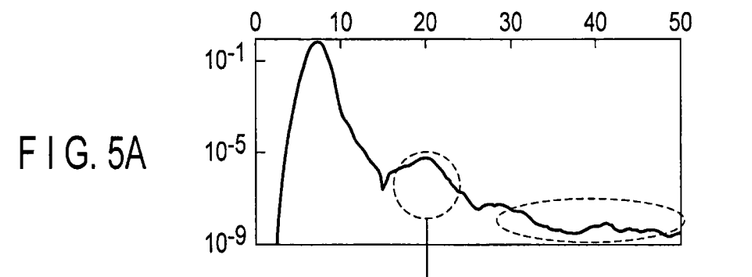
FIGS. 5A and 5B are graphs showing a characteristic associated with the amount of reflected light in an optical input part.
Figure 5B:
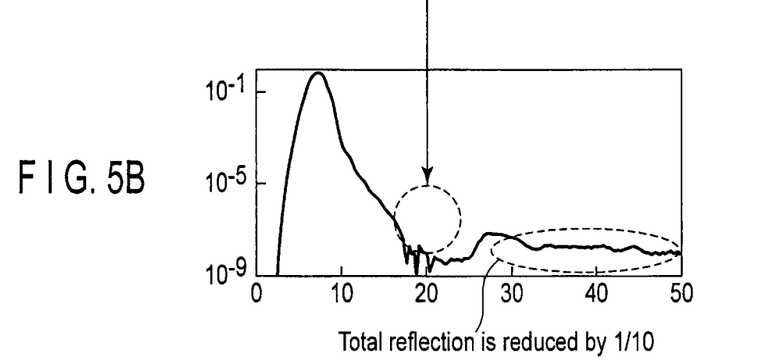

FIGS. 5A and 5B show the difference in reflection, depending upon whether the Si-thin-line waveguide 12 is deviated in the optical input part 32. FIG. 5A shows a case where the Si-thin-line waveguide 12 is not deviated, and FIG. 5B shows a case where the Si-thin-line waveguide 12 is deviated. If the Si-thin-line waveguide 12 is positioned at the lateral center of the optical input part 32 as shown in FIG. 5A (i.e., the lateral shift is zero), the reflection in the optical input part 32 is large. Reflection in the optical input part 32 is a factor of increasing the return light in the Si-thin-line waveguide 12. However, if the Si-thin-line waveguide 12 is shifted from the lateral center of the optical input part 32 as shown in FIG. 5B (in this case, the lateral shift is 0.6 µm), the reflection in the optical input part 32 is small. In FIG. 5B, the total reflection is reduced by 1/10, although the reflection occurs slightly later than in the case of FIG. 15A.

Figure 6:
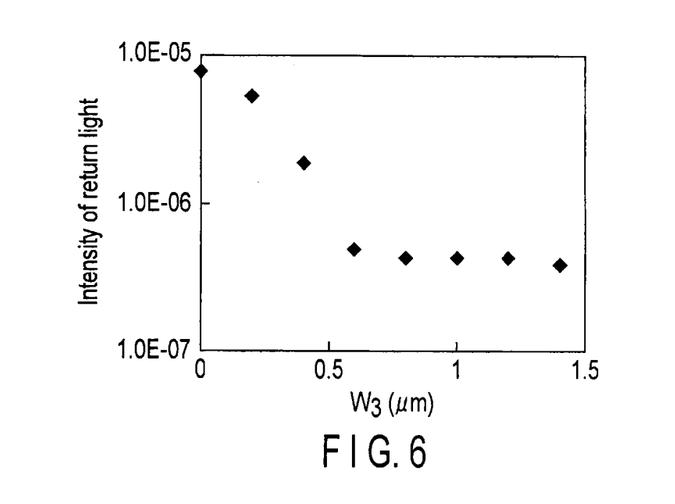
FIG. 6 is a graph showing changes in the intensity of return light in the optical input part.

FIG. 6 is a graph showing changes in the intensity of return light with respect to the amount shift of the Si-thin-line waveguide 12 in the optical input part 32, and is directed to a case where width W1 of the Si-thin-line waveguide 12 is set to 0.3 µm, and width W2 of the front end of the optical input part 32 is set to 0.5 µm. If lateral shift W3 of the front end of the optical input part 32 is not less than 0.5 µm, the intensity of return light is sufficiently low as shown in FIG. 6. Namely, when lateral shift W3 is not less than 0.5 µm, the strong reflection peak disappears and the total return light is reduced.

The reason why the intensity of the return light is sufficiently low as described above seems to lie in that the front end of the optical input part 32 does not overlap with the Si-thin-line waveguide 12, but the linear part 12b of the Si-thin-line waveguide 12 obliquely intersects with the optical input part 32. Accordingly, it is desirable that width W1 of the Si-thin-line waveguide 12, width W2 of the front end of the optical input part 32 and lateral shift W3 should satisfy the following relationship:

$$(W1+W2)/2 < W3 \qquad (1)$$

Figure 7A:
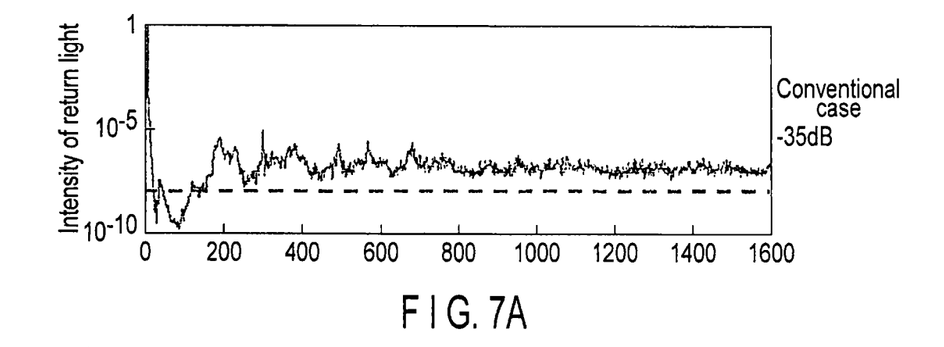
FIGS. 7A and 7B are graphs showing the intensity of return light in a waveguide.
Figure 7B:
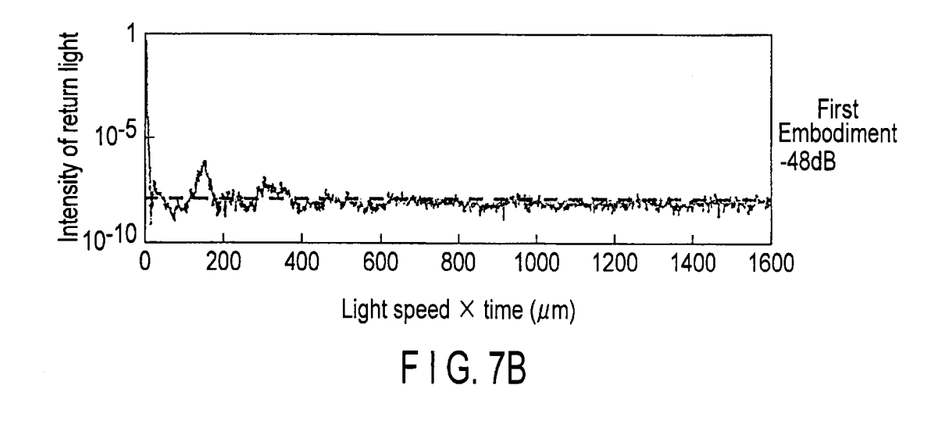

FIGS. 7A and 7B are graphs showing the difference in the intensity of return light in the Si-thin-line waveguide 12 between a case where the optical input part 32 exists, and a case where it does not exist. If no optical input part 32 exists (conventional case), the intensity of the return light is as high as about −35 dB, as is shown in FIG. 7A. In contrast, if the optical input part 32 exists (the first embodiment), the intensity of the return light is as low as about −48 dB, as is shown in FIG. 7B. Namely, the structure of the first embodiment suppresses, to −48 dB or less, the return light to the LD light source. Thus, the first embodiment can provide a semiconductor light-receiving element suitable for stabilization of the outputs of the LD light source and the optical transmitting/receiving unit.

Figure 8:
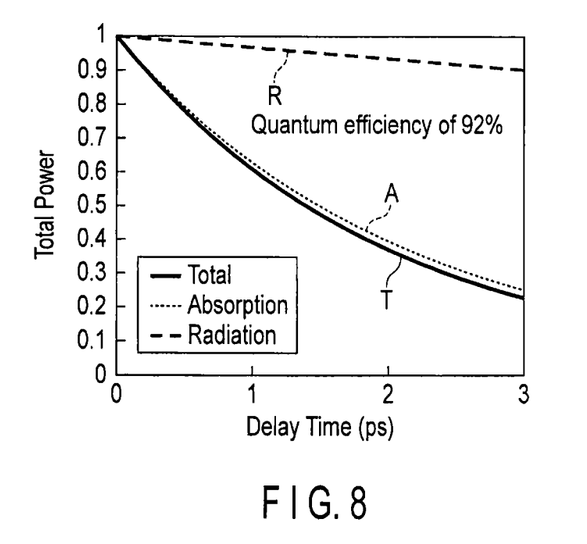
FIG. 8 is a graph showing the quantum efficiency of the semiconductor light-receiving element of the first embodiment.

FIG. 8 shows the result of finite difference time domain (FDTD) simulation executed to detect the light-receiving efficiency of the ring-shaped semiconductor light-receiving element of the embodiment. In FIG. 8, A is the index of absorbency, R is the emissivity, and T is the total quantum efficiency. A, R and T in the figure satisfy the following equation:

$$T=A/(A+R)=92\% \tag{2}$$

It can be understood from this equation that a sufficiently high quantum efficiency can be obtained. Thus, the structure of the first embodiment provides a light-receiving efficiency of 90% or more, allowing a compact, highly efficient semiconductor light-receiving element to be realized.

As described above, since the light-receiving part 31 is formed using the same semiconductor laminated structure as that of a micro-ring LD formed on the Si substrate, the light-receiving element can be mounted on a single chip along with the micro-ring LD.

In addition, in the first embodiment, the optical input unit 32 having its front end tapered is provided at an end of the light-receiving part 31. Accordingly, light coupled between the optical-input Si-thin-line waveguide 12 and the light-receiving part 31 is prevented from being reflected, and the light coupled to the light-receiving part 31 is prevented from returning to the optical-input Si-thin-line waveguide 12 and then to the ring LD source. Therefore, a compact semiconductor light-receiving element that enables the light transmitting/receiving unit to perform stable operation can be realized. Namely, a semiconductor light-receiving element can be realized, which can be mounted on a single chip along with, for example, the micro-ring LD and exhibits a high efficiency and a sufficiently reduced reflection.

Moreover, since in the first embodiment, Si is used as the material of the waveguide 12, optical loss within the waveguide can be reduced. Further, since the end of the Si-thin-line waveguide 12 close to the light-receiving part 31 is tapered, return light at this end can be reduced.

It is not always necessary to obliquely make the optical input part 32 intersect with linear part 12b of the Si-thin-line waveguide 12. Alternatively, the waveguide 12 may be provided coaxially with the optical input part 32 as shown in FIG. 9.

Figure 9:
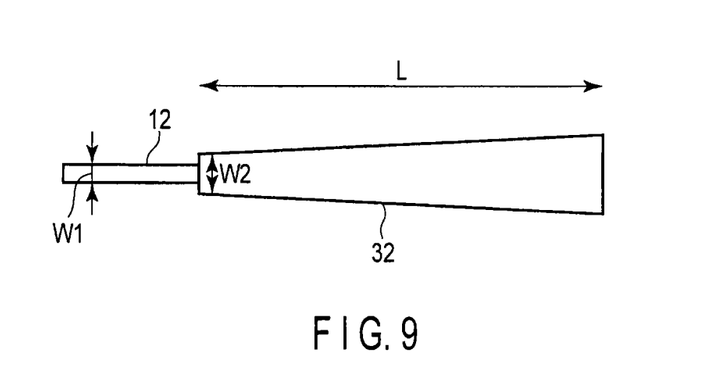
FIG. 9 is a schematic diagram showing the relationship between the tip of the optical input part and the waveguide.

The optical input part 32 is provided to prevent significant reflection from occurring at the interface between the light-receiving part 31 and the Si-thin-line waveguide 12, and has a front end tapered as shown in FIG. 9. If the front end of the optical input part 32 is large, the reflection at the front end is inevitably large. In view of this, it is necessary to narrow the width of the front end of the optical input part 32 as far as possible. However, if the width of the front end is too small, return light cannot be externally emitted through the front end of the optical input part 32. This is disadvantageous to reduction of the return light in the Si-thin-line waveguide 12.

Figure 10:
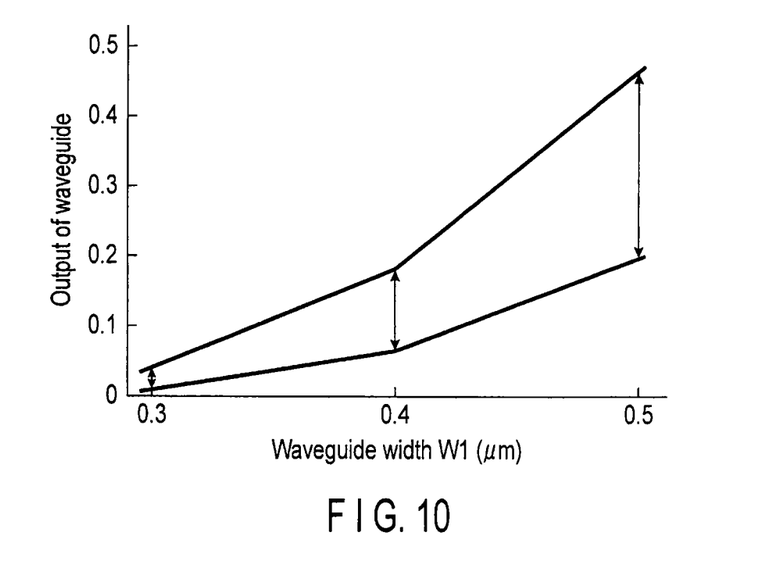
FIG. 10 is a graph showing the relationship between the output of the optical input part and the width of the waveguide.

FIG. 10 shows the relationship between the output of the Si-thin-line waveguide 12 directed from the light-receiving part side to the outside, and width W1 of the Si-thin-line waveguide 12. More specifically, FIG. 10 is directed to a case where the element length L is set to 85 to 100 μm, and front-end width W2 of the optical input part 32 is set to 0.5 μm. Width W1 is variable.

If W1 is set to 0.3 μm, little light is output from the Si-thin-line waveguide 12. However, if W1 is set to 0.5 μm, a large amount of light is output from the Si-thin-line waveguide 12. Namely, if W1 is increased compared to W2, return light is not output from the front end of the optical input part 32, but is passed through the Si-thin-line waveguide 12. This is disadvantageous to reduction of return light. Therefore, it is necessary to set W2 to a low value, but to make it fall within a range of W2>W1. However, this is not applied to the case where the optical input part 32 is made to obliquely intersect with linear part 12b as shown in FIG. 4.

Second Embodiment

Figure 11:
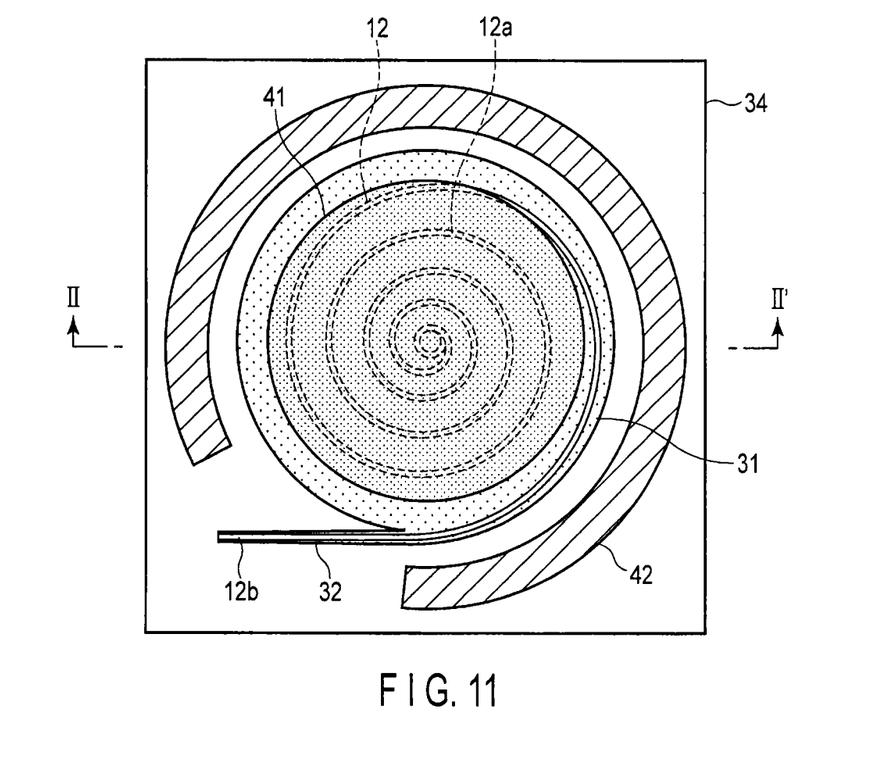
FIG. 11 is a plan view showing a schematic structure of a semiconductor light-receiving element according to a second embodiment.
Figure 12:
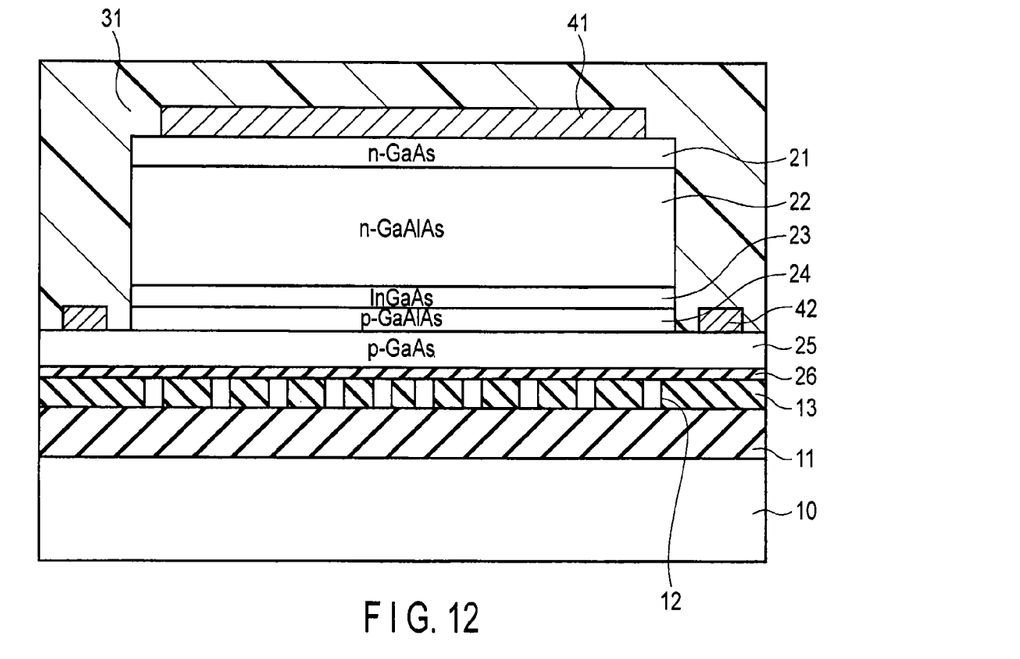
FIG. 12 is a cross-sectional view showing a schematic structure of the semiconductor light-receiving element according to the second embodiment.

FIGS. 11 and 12 are views for explaining a schematic structure of a semiconductor light-receiving element according to a second embodiment. FIG. 11 is a plan view showing the positional relationship between the light-receiving part, the optical input part and the waveguide. FIG. 12 is a cross-sectional view taken along line II-II' of FIG. 11. In these figures, elements similar to those shown in FIGS. 1 and 2 are denoted by corresponding reference numbers, and no detailed description will be given thereof. Further, FIG. 11 only shows necessary structural elements for enabling the feature of the second embodiment to be easily understood.

The second embodiment is basically the same as the first embodiment, and differs therefrom only in the structure of the light-receiving part 31.

The light-receiving part 31 of the second embodiment has a disk shape instead of a ring shape. Further, an n-side electrode 41 is formed on a circular n-type GaAs contact layer 21. A p-type GaAs contact layer 25 extends to the outside, and a p-side electrode 42 is formed on the extended portion of the layer 25.

Further, the Si-thin-line waveguide 12 extends to the center of the circular light-receiving part 31, and the radius of curvature of the innermost portion of the Si-thin-line waveguide 12 is extremely small. Namely, the radius of curvature of the innermost portion of the Si-thin-line waveguide 12 is smaller than the radius of curvature of the central portion (terminal portion) of the spiral, assuming that the distance between adjacent ones of circumferential lines is constant.

As is evident from FIG. 11, in the second embodiment, linear part 12b of the Si-thin-line waveguide 12 extends along the axis of the optical input part 32, instead of obliquely intersecting the optical input part 32. However, it is a matter of course that the respective centers of the optical input part 32 and the Si-thin-line waveguide 12 may be shifted to make them intersect each other, as in the first embodiment.

Figure 13:
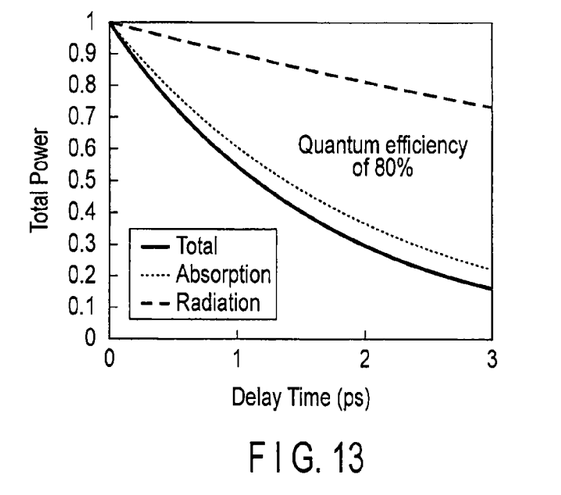
FIG. 13 is a graph showing the quantum efficiency of the semiconductor light-receiving element of the second embodiment.

FIG. 13 shows the result of FDTD simulation executed to detect the light-receiving efficiency of the disk-shaped semiconductor light-receiving element of the second embodiment. In FIG. 13, A is the index of absorbency, R is the emissivity, and T is the total quantum efficiency. From FIG. 13, it is evident that the structure of the second embodiment can provide a light-receiving efficiency of 80% or more. This means that a compact and high-efficient semiconductor light-receiving element can be realized.

Therefore, it is a matter of course that the second embodiment can provide the same advantage as the first embodiment. In addition, in the second embodiment, since the light-receiving part 31 has a disk shape instead of the ring shape, the area for locating the Si-thin-line waveguide 12 can be increased. This leads to an increase in light-receiving capacity to thereby reduce return light or saturated absorption. Further, since in the second embodiment, the radius of curvature of the terminal of the Si-thin-line waveguide 12 is reduced, light is emitted at the terminal of the waveguide 12, with the result that the return light at the terminal can be further reduced.

(Modification)

The invention is not limited to the above-described embodiments.

In the embodiments, a GaAs substrate is used as an element-forming substrate for the light-receiving part, and a double-hetero structure, in which an InAlGaAs active layer is held between GaAlAs clad layers, is provided on the substrate. However, the invention is not limited to this, but may employ a structure in which a double-hetero structure comprising an InAlGaAs active layer, and InP clad layers holding the active layer therebetween is provided on an InP substrate. Also in this case, a multilayer obtained by holding an InGaAs/GaAs multiplex quantum well layer between InAlGaAs light-blocking layers may be used as the active layer. Further, the semiconductor multilayer structure for forming the light-receiving part is not always limited to a group III-V semiconductor. It is sufficient if the semiconductor multilayer structure for forming the light-receiving part can be mounted on a substrate along with, for example, a ring LD, and can efficiently detect an optical signal input through the waveguide. For instance, Si doped with a rare earth or GeSn can also be used as a semiconductor material.

Further, although in the embodiments, the optical input part is made to obliquely intersect the linear Si-thin-line waveguide, it need not always intersect the waveguide. It is sufficient if return light can be sufficiently suppressed. It is desirable that the front end of the Si-thin-line waveguide should be tapered or should have a large curvature. However, if the influence of return light at the front end is small, it is not always necessary to construct the waveguide in this way.

Also, although in the embodiments, the Si-thin-line waveguide is provided below the light-receiving part, it may be provided above the light-receiving part. In this case, a group III-V semiconductor, such as GaAs, can be used as the material of a base substrate instead of Si.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-receiving element, comprising:
   a light-receiving part provided on a substrate and having a semiconductor multilayer structure whose outer shape is round;
   an optical input part formed of a circumferential extension of a peripheral portion of the semiconductor multilayer structure, and having a tapered front end in a direction parallel to the substrate; and
   a silicon-thin-line waveguide configured to couple light with the optical input part, the silicon-thin-line waveguide including a linear part extending through an upper-side area or a lower-side area of the optical input part onto at least one area of an upper-side area and a lower-side area of the light-receiving part, and a spiral part connected to the linear part and formed spirally on the at least one area, wherein
   the linear part of the silicon-thin-line waveguide does not overlap a front end face of the optical input part but does overlap a part of a side surface of the optical input part in a direction perpendicular to the substrate.

2. The element of claim 1, wherein the light-receiving part is shaped like a ring or a disk.

3. The element of claim 1, wherein the side surface of the optical input part obliquely intersects the linear part of the silicon-thin-line waveguide in the direction perpendicular to the substrate.

4. The element of claim 3, wherein $(W1+W2)/2<W3$ is satisfied, where W1 is a width of the silicon-thin-line waveguide in the optical input part, W2 is a width of a front end of the optical input part, and W3 is a distance between a lateral center of the silicon-thin-line waveguide in the optical input part, and a lateral center of the optical input part.

5. The element of claim 1, wherein a terminal portion of the silicon-thin-line waveguide close to the light-receiving part is tapered.

6. The element of claim 1, wherein when a radial distance between adjacent circumferential lines of the silicon-thin-line waveguide is constant, a terminal portion of the silicon-thin-line waveguide close to the light-receiving part has a curvature radius smaller than a curvature radius of a center portion of the spiral part.

7. The element of claim 1, wherein the substrate is a silicon substrate.

8. The element of claim 1, wherein the substrate is an SOI substrate, and the silicon-thin-line waveguide is formed of an Si layer included in the SOI substrate.

9. The element of claim 1, wherein the light-receiving part has a double-hetero structure in which an active layer is held between clad layers.

10. The element of claim 9, wherein the double-hetero structure is formed of a group III-V semiconductor.

11. The element of claim 9, wherein the active layer has a multiplex quantum well structure in which well layers and blocking layers are alternately stacked.

12. A semiconductor light-receiving element, comprising:
    a light-receiving part provided on a substrate and having a semiconductor multilayer structure whose outer shape is round;
    an optical input part formed of a circumferential extension of a peripheral portion of the semiconductor multilayer structure, and having a tapered front end in a direction parallel to the substrate; and
    a silicon-thin-line waveguide configured to couple light with the optical input part, the silicon-thin-line waveguide including a linear part extending through an upper-side area or a lower-side area of the optical input part onto at least one area of an upper-side area and a lower-side area of the light-receiving part, and a spiral part connected to the linear part and formed spirally on the at least one area, wherein
    a width W1 of the silicon-thin-line waveguide is less than a width W2 of a front end face of the optical input part, the width W1 and the width W2 being defined at a same position along the silicon-thin-line waveguide.

13. The element of claim 12, wherein the light-receiving part is shaped like a ring or a disk.

14. The element of claim 12, wherein a terminal portion of the silicon-thin-line waveguide close to the light-receiving part is tapered.

15. The element of claim 12, wherein when a radial distance between adjacent circumferential lines of the silicon-thin-line waveguide is constant, a terminal portion of the silicon-thin-line waveguide close to the light-receiving part has a curvature radius smaller than a curvature radius of a center portion of the spiral part.

16. The element of claim 12, wherein the substrate is a silicon substrate.

17. The element of claim 12, wherein the substrate is an SOI substrate, and the silicon-thin-line waveguide is formed of an Si layer included in the SOI substrate.

18. The element of claim 12, wherein the light-receiving part has a double-hetero structure in which an active layer is held between clad layers.

19. The element of claim 18, wherein the double-hetero structure is formed of a group III-V semiconductor.

20. The element of claim 18, wherein the active layer has a multiplex quantum well structure in which well layers and blocking layers are alternately stacked.

\* \* \* \* \*